(12) United States Patent
Ogasawara

(10) Patent No.: US 8,676,148 B2
(45) Date of Patent: Mar. 18, 2014

(54) DIFFERENTIAL AMPLIFIER CIRCUIT AND WIRELESS RECEIVING APPARATUS

(75) Inventor: Yosuke Ogasawara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 878 days.

(21) Appl. No.: 12/754,748

(22) Filed: Apr. 6, 2010

(65) Prior Publication Data

US 2011/0130109 A1    Jun. 2, 2011

(30) Foreign Application Priority Data

Dec. 2, 2009 (JP) .................. 2009-274677

(51) Int. Cl.
*H04B 1/16* (2006.01)
(52) U.S. Cl.
USPC ........ 455/341; 455/251.1; 455/293; 455/311; 327/108
(58) Field of Classification Search
USPC ........... 455/313, 341, 280, 234.1, 251.1, 324, 455/345, 232.1, 323, 334; 330/255, 253, 330/260, 257, 263, 261; 327/108, 109
See application file for complete search history.

(56) References Cited

U.S. PATENT DOCUMENTS

| 5,061,902 | A |   | 10/1991 | Carpenter |
|---|---|---|---|---|
| 5,783,970 | A | * | 7/1998 | Pleitz ........................... 330/269 |
| 5,869,993 | A | * | 2/1999 | Vorenkamp .................. 327/317 |
| 6,384,685 | B1 | * | 5/2002 | Juang ........................... 330/264 |
| 6,414,552 | B1 | * | 7/2002 | Kronmueller et al. ........ 330/288 |
| 6,469,562 | B1 | * | 10/2002 | Shih et al. ..................... 327/362 |
| 6,771,126 | B2 | * | 8/2004 | Blankenship et al. ........ 330/257 |
| 6,862,439 | B2 | * | 3/2005 | Feng .......................... 455/234.1 |
| 7,057,544 | B2 | * | 6/2006 | Lilamwala .................... 341/150 |
| 7,061,320 | B2 | * | 6/2006 | Kimura et al. ............... 330/255 |
| 7,224,225 | B2 | * | 5/2007 | Chang .......................... 330/253 |
| 7,526,264 | B2 | * | 4/2009 | Bargroff et al. .............. 455/140 |
| 7,576,610 | B2 | * | 8/2009 | Dalena ......................... 330/260 |
| 7,719,352 | B2 | * | 5/2010 | Kim et al. ..................... 330/51 |
| 7,990,178 | B2 | * | 8/2011 | Liu et al. ........................ 326/83 |
| 7,999,617 | B2 | * | 8/2011 | Bruin ............................ 330/257 |
| 8,106,684 | B2 | * | 1/2012 | Takeuchi et al. ............. 327/108 |
| 8,368,426 | B2 | * | 2/2013 | Lee et al. ........................ 326/82 |
| 2006/0237831 | A1 |   | 10/2006 | Danno et al. |
| 2010/0102855 | A1 | * | 4/2010 | Takahashi ..................... 327/108 |

FOREIGN PATENT DOCUMENTS

| JP | 02-082804 | 3/1990 |
|---|---|---|
| JP | 04-090207 | 3/1992 |
| JP | 06-006143 | 1/1994 |
| JP | 2005-045702 | 2/2005 |
| JP | 2009-278117 | 11/2009 |
| WO | 2009019761 | 2/2009 |

OTHER PUBLICATIONS

Koutani et al, A Highly Linear CMOS Buffer Circuit with an Adjustable Output Impedance, IEEE 2003 Custom Integrated Circuits Conference.
Japanese Office Action for Japanese Application No. 2009-274677 mailed on Dec. 25, 2012.

* cited by examiner

*Primary Examiner* — Pablo Tran
(74) *Attorney, Agent, or Firm* — White & Case LLP

(57) ABSTRACT

A differential amplifier circuit includes a source follower circuit to which is input one of the differential signals and a common source circuit that is connected in series with the source follower circuit and to which is input the other of the differential signals.

14 Claims, 7 Drawing Sheets

DIFFERENTIAL AMPLIFIER CIRCUIT AND WIRELESS RECEIVING APPARATUS

CROSS-REFERENCE TO RELATED APPLICATIONS

This application is based upon and claims the benefit of priority from the prior Japanese Patent Application No. 2009-274677, filed on Dec. 2, 2009; the entire contents of which are incorporated herein by reference.

BACKGROUND OF THE INVENTION

1. Field of the Invention

The present invention relates to a differential amplifier circuit and a wireless receiving apparatus, and particularly to a differential amplifier circuit including a common source circuit and a source follower circuit.

2. Description of the Related Art

In a differential amplifier circuit, a common source circuit or a common gate circuit is generally used for securing gain and a source follower circuit is generally used for securing linearity.

For example, Japanese Patent Application Laid-open No. H04-90207 discloses, for an amplifier that includes a preceding-stage amplifier circuit including a common source circuit at the first stage thereof and an output-stage amplifier circuit including a source follower circuit connected to the output of the preceding-stage amplifier circuit, a method of disposing an intermediate-stage amplifier circuit, which includes a source follower circuit with the load on the source side changed to a variable load, between the preceding-stage amplifier and the output-stage amplifier.

However, the use of a common source circuit and a common gate circuit results in poor linearity and the use of a source follower circuit results in poor gain. Moreover, if, in order to secure linearity, source degeneration is applied in a common source circuit; then it becomes difficult to perform a low-voltage operation.

Besides, since the method disclosed in Japanese Patent Application Laid-open No. H04-90207 includes multi-stage connection between the source follower circuit and the common source circuit, separate bias currents are passed to the source follower circuit and the common source circuit. That causes an increase in the amount of consumption current.

BRIEF SUMMARY OF THE INVENTION

A differential amplifier circuit according to an embodiment of the present invention comprises: a source follower circuit to which is input one of differential signals; and a common source circuit that is connected in series with the source follower circuit and to which is input other of differential signals.

A wireless receiving apparatus according to an embodiment of the present invention comprises: a receiving antenna that receives a spatially-propagated radio-frequency signal; a low noise amplifier that performs differential amplification of the radio-frequency signal received by the receiving antenna; a mixer that converts the radio-frequency signal amplified by the low noise amplifier into either one of a baseband signal and an intermediate frequency signal and outputs as a differential signal; a buffer that is connected in between the low noise amplifier and the mixer and that is configured as an amplifier circuit including a source follower circuit, to which is input one of the differential signals, and a common source circuit, to which is input other of the differential signals, that are mutually connected in series; and a lowpass filter that attenuates an unnecessary high-pass component from the baseband signal or the intermediate frequency signal obtained by conversion performed by the mixer.

DETAILED DESCRIPTION OF THE INVENTION

Exemplary embodiments of a differential amplifier circuit according to the present invention are described in detail below with reference to the accompanying drawings. The present invention is not limited to these exemplary embodiments.

First Embodiment

Figure 1:
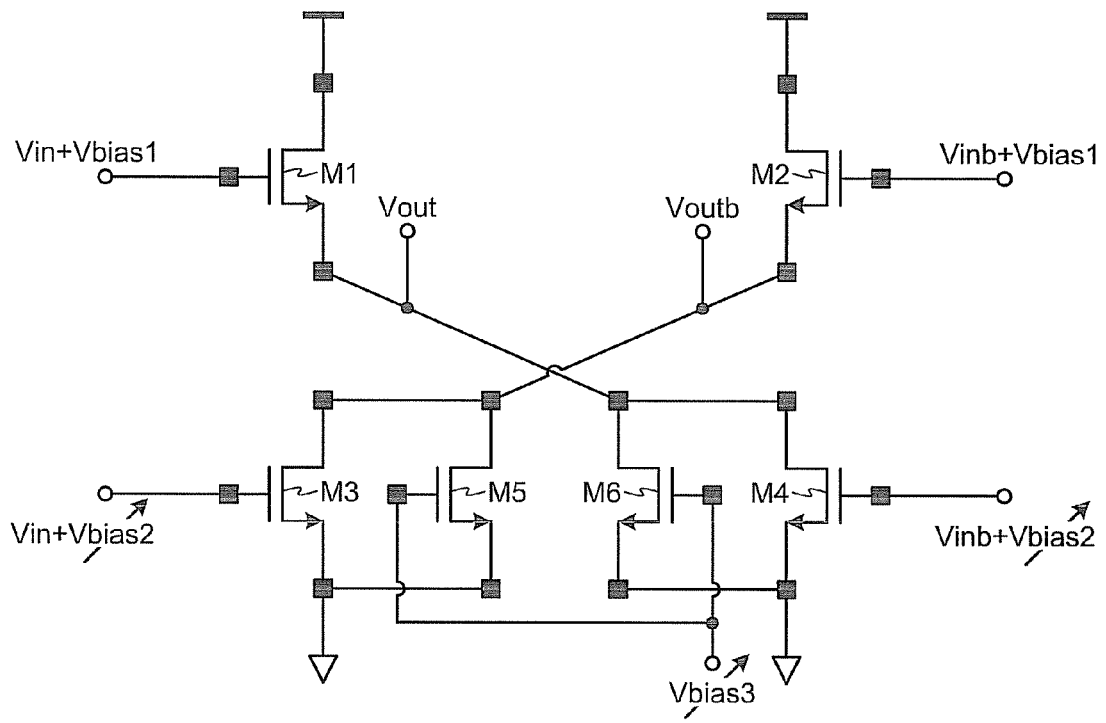
FIG. 1 is a circuit diagram of an outline configuration of a differential amplifier circuit according to a first embodiment of the present invention.

FIG. 1 is a circuit diagram of an outline configuration of a differential amplifier circuit according to a first embodiment of the present invention.

As illustrated in FIG. 1, the differential amplifier circuit includes N-channel field-effect transistors M1 to M6. The field-effect transistor M1 is connected in series with the field-effect transistor M4 and the field-effect transistor M2 is connected in series with the field-effect transistor M3. On the other hand, the field-effect transistor M6 is connected in parallel with the field-effect transistor M4 and the field-effect transistor M5 is connected in parallel with the field-effect transistor M3. Besides, for the purpose of circuit operations, a power-supply voltage (hereinafter, "VDD") is connected to the field-effect transistors M1 and M2. To the field-effect transistors M3 to M6 is connected a voltage (hereinafter, "VSS") that is lower than the power-supply voltage. Meanwhile, in the present embodiment, the VSS is assumed to be the ground voltage. Moreover, with reference to diagrams from FIG. 2 onward, the VDD and the VSS are assumed to have the same configuration. Furthermore, instead of using the N-channel field-effect transistors M1 to M6, it is also possible to configure the differential amplifier circuit with P-channel field-effect transistors, NPN transistors, or PNP transistors.

Herein, the field-effect transistors M1 and M2 can function as source follower circuits, while the field-effect transistors M3 and M4 can function as common source circuits that are connected in series with the source follower circuits. The field-effect transistor M6 can function as a current source that adjusts the transconductance of the field-effect transistor M4 while keeping the current (i.e., transconductance) of the field-effect transistor M1 at a constant level. Similarly, the field-effect transistor M5 can function as a current source that adjusts the transconductance of the field-effect transistor M3 while keeping the current (i.e., transconductance) of the field-effect transistor M2 at a constant level.

To the gates of the field-effect transistors M1 and M3 is input a differential signal Vin and to the gates of the field-effect transistors M2 and M4 is input a differential signal Vinb. The differential signal Vin can correspond to one of the differential signals Vin and Vinb, while the differential signal Vinb can correspond to the other of the differential signals Vin and Vinb.

Moreover, to the gates of the field-effect transistors M1 and M2 is applied a bias voltage Vbias1, to the gates of the field-effect transistors M3 and M4 is applied a bias voltage Vbias2, and to the gates of the field-effect transistors M5 and M6 is applied a bias voltage Vbias3. The bias voltages Vbias2 and Vbias3 can be varied.

From the connection point between the field-effect transistors M1 and M4 is output a differential signal Vout, while from the connection point between the field-effect transistors M2 and M3 is output a differential signal Voutb. The differential signals Vout and Voutb can correspond to a differential pair of the differential output.

Herein, by connecting the common source circuits in series with the source follower circuits, the common source circuits can be used to make up for the deficit in the gain achieved by the source follower circuits while securing linearity in the source follower circuits. Besides, the bias currents flowing in the source follower circuits can be reused in the common source circuits. Hence, it becomes possible to achieve linearity as well as gain in the differential amplifier circuit while preventing an increase in the consumption current.

Moreover, while achieving linearity as well as gain in the differential amplifier circuit, it is possible to curb the number of elements connected in series between the current potential and the ground potential and hence deal with a low-voltage operation.

Furthermore, by connecting the field-effect transistor M5 in series with the field-effect transistor M3 and connecting the field-effect transistor M6 in series with the field-effect transistor M4, the transconductance of the field-effect transistors M3 and M4 becomes adjustable. For that reason, while achieving linearity as well as gain in the differential amplifier circuit, it becomes possible to increase linearity or increase gain in the differential amplifier circuit for optimizing the balance between linearity and gain.

Figure 2:
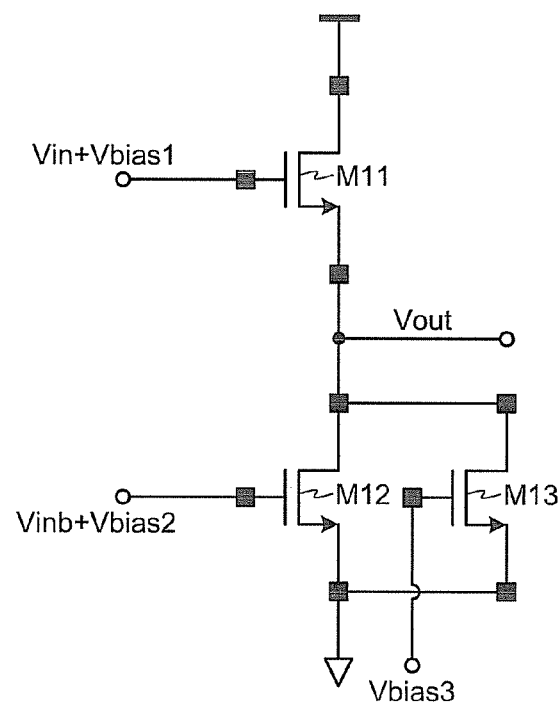
FIG. 2 is a circuit diagram of a differential pair in the differential amplifier circuit illustrated in FIG. 1, with one side of the differential pair being illustrated in a simplified form.

FIG. 2 is a circuit diagram of a differential pair in the differential amplifier circuit illustrated in FIG. 1, with one side of the differential pair being illustrated in a simplified form.

The circuit illustrated in FIG. 2 includes N-channel field-effect transistors M11 to M13. The field-effect transistor M11 is connected in series with the field-effect transistor M12, while the field-effect transistor M13 is connected in parallel with the field-effect transistor M12. Herein, the field-effect transistor M11 can function as a source follower circuit, while the field-effect transistor M12 can function as a common source circuit that is connected in series with the source follower circuit. The field-effect transistor M13 can function as a current source that adjusts the transconductance of the field-effect transistor M12 while keeping the current (i.e., transconductance) of the field-effect transistor M11 at a constant level. Meanwhile, instead of using the N-channel field-effect transistors M11 to M13, it is also possible to configure the differential amplifier circuit with P-channel field-effect transistors, NPN transistors, or PNP transistors.

To the gate of the field-effect transistor M11 is input the differential signal Vin and to the gate of the field-effect transistor M12 is input the differential signal Vinb. Besides, to the gate of the field-effect transistor M11 is applied the bias voltage Vbias1, to the gate of the field-effect transistor M12 is applied the bias voltage Vbias2, and to the gate of the field-effect transistor M13 is applied the bias voltage Vbias3. Moreover, from the connection point between the field-effect transistors M11 and M12 is output the differential signal Vout.

Figure 3:
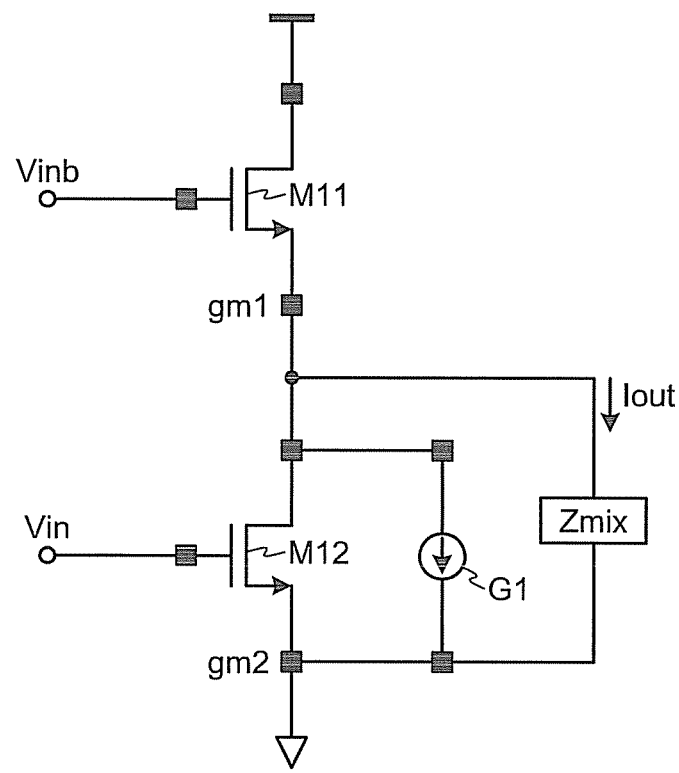
FIG. 3 is an equivalent circuit schematic of a simplified form of the amplifier circuit illustrated in FIG. 2 with description about load in subsequent stages.

FIG. 3 is an equivalent circuit schematic of a simplified form of the amplifier circuit illustrated in FIG. 2.

In FIG. 3, the field-effect transistor M13 illustrated in FIG. 2 can be equivalently represented by a current source G1. Herein, if a drain conductance gds of the field-effect transistors M11 and M12 is ignored, then a transconductance Gm of the amplifier circuit illustrated in FIG. 3 can be obtained using Equation (1) given below.

$$Gm = Iout/Vin = (gm1 + gm2)/(Zmix \times gm1 + 1) \quad (1)$$

where, Zmix is the input impedance of latter stage, Iout is the output current, gm1 is the transconductance of the field-effect transistor M11, and gm2 is the transconductance of the field-effect transistor M12.

In the absence of the field-effect transistor M12, the equivalent circuit illustrated in FIG. 3 is just a source follower circuit. A source follower circuit does not get saturated by direct-current (DC) components and can perform linear operations if the transconductance gm1 is sufficiently large. However, a sufficient gain cannot be achieved with only the source follower circuit. Rather, a sufficient gain can be achieved by connecting the field-effect transistor M12 in series with the field-effect transistor M11 and thus making the field-effect transistor M12 function as a common source circuit.

Herein, if the field-effect transistor M11 is equivalently represented as by resistor R, then a transconductance GM' of the common source circuit can be obtained using Equation (2) given below.

$$Gm' = Iout/Vin = gm2/(Zmix/R + 1) \quad (2)$$

By increasing the transconductance gm2, the common source circuit can achieve sufficient gain. However, since the transconductance gm2 varies significantly depending on the differential signal Vin, the linearity is poor.

Thus, if the transconductance gm2 varies significantly depending on the differential signal Vin, then the linearity of the equivalent circuit illustrated in FIG. 3 also deteriorates. In regard to that problem, the transconductance gm2 can be adjusted by connecting the current source G1 in parallel with the field-effect transistor M12 and by adjusting the current value of the current source G1. As a result, the balance between linearity and gain in the equivalent circuit illustrated in FIG. 3 can be optimized without causing a decrease in the headroom (margin at the time of maximum input).

Figure 4A:
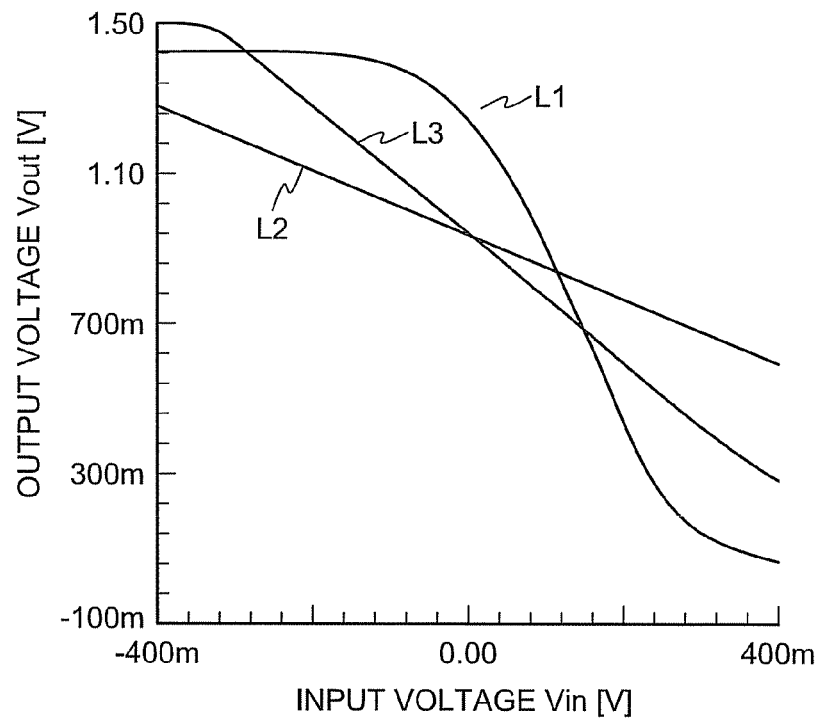
FIG. 4A is a graph of a relation between input voltages and output voltages of the amplifier circuit illustrated in FIG. 2 in comparison with a common source circuit and a source follower circuit and FIG. 4B is a graph of a relation between input voltages and voltage gains of the amplifier circuit illustrated in FIG. 2 is illustrated in comparison with a common source circuit and a source follower circuit.
Figure 4B:
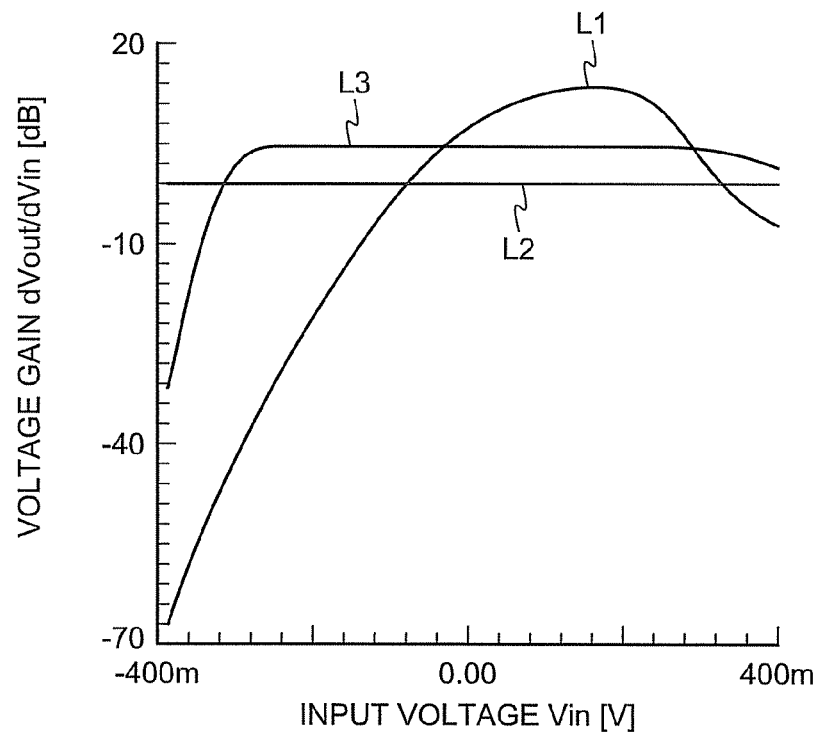

FIG. 4A is a graph of the relation between input voltages and output voltages of the amplifier circuit illustrated in FIG. 2 is illustrated in comparison with a common source circuit and a source follower circuit. FIG. 4B is a graph of the relation between input voltages and voltage gains of the amplifier circuit illustrated in FIG. 2 is illustrated in comparison with a common source circuit and a source follower circuit. In FIG. 4, L1 represents the characteristics of the common source circuit, L2 represents the characteristics of the source follower circuit, and L3 represents the characteristics of the amplifier circuit illustrated in FIG. 2.

As illustrated in FIG. 4, in the common source circuit, a high gain is achieved but the linearity is poor. On the other hand, in the source follower circuit, favorable linearity is achieved bit the gain is poor. In contrast, in the amplifier circuit illustrated in FIG. 2, a sufficient gain can be achieved while maintaining favorable linearity.

Second Embodiment

Figure 5:
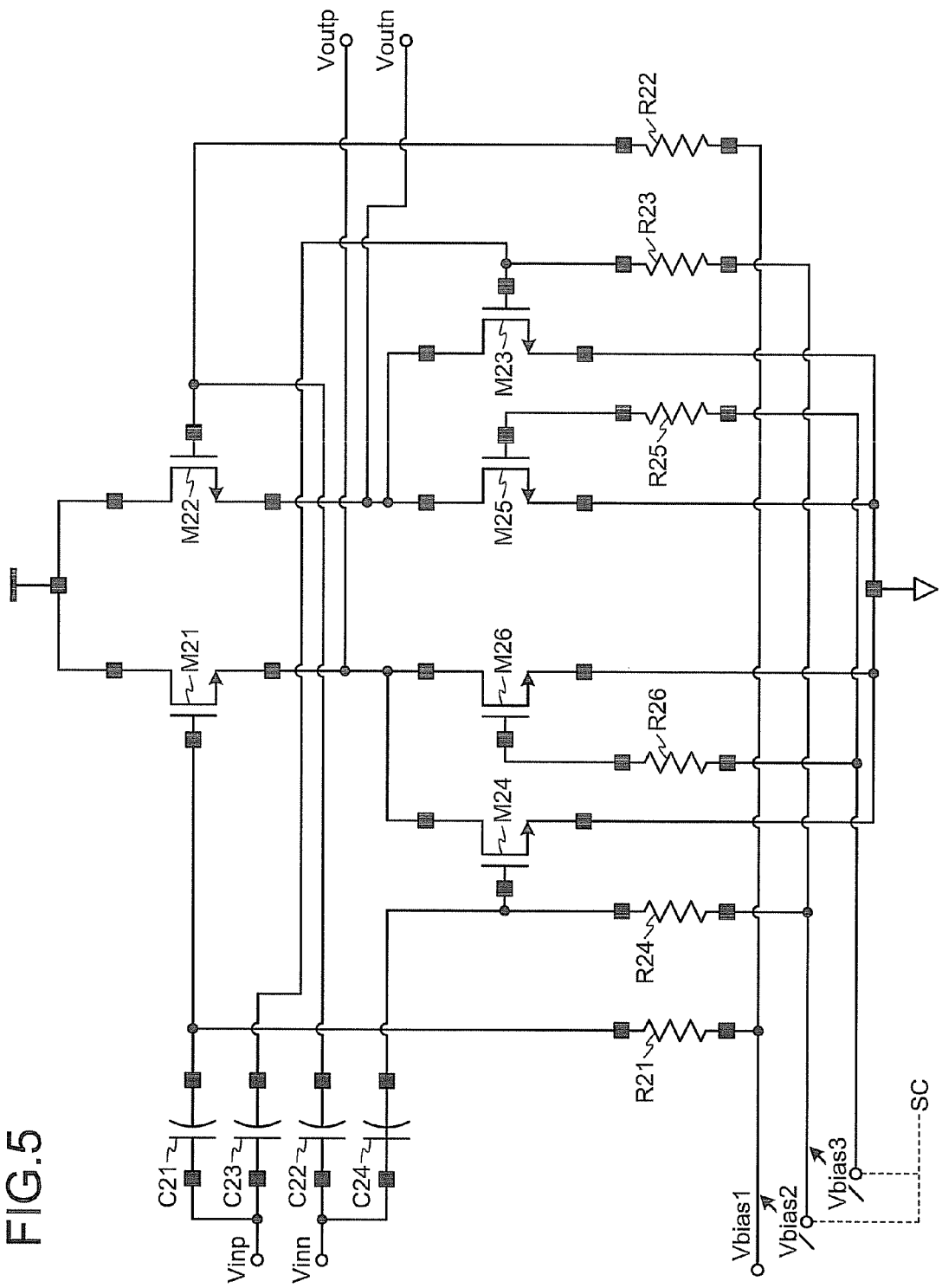
FIG. 5 is a circuit diagram of an outline configuration of a differential amplifier circuit according to a second embodiment of the present invention.

FIG. 5 is a circuit diagram of an outline configuration of a differential amplifier circuit according to a second embodiment of the present invention.

As illustrated in FIG. 1, the differential amplifier circuit includes N-channel field-effect transistors M21 to M26, capacitors C21 to C24, and resistors R21 to R26. The capacitors C21 to C24 remove DC components from input signals and pass only alternate-current (AC) components. The field-effect transistor M21 is connected in series with the field-effect transistor M24 and the field-effect transistor M22 is connected in series with the field-effect transistor M23. On the other hand, the field-effect transistor M26 is connected in parallel with the field-effect transistor M24 and the field-effect transistor M25 is connected in parallel with the field-effect transistor M23. Meanwhile, instead of using the N-channel field-effect transistors M21 to M26, it is also possible to configure the differential amplifier circuit with P-channel field-effect transistors, NPN transistors, or PNP transistors.

Herein, the field-effect transistors M21 and M22 can function as source follower circuits, while the field-effect transistors M23 and M24 can function as common source circuits that are connected in series with the source follower circuits. The field-effect transistor M26 can function as a current source that adjusts the transconductance of the field-effect transistor M24 and the field-effect transistor M25 can function as a current source that adjusts the transconductance of the field-effect transistor M23.

To the gates of the field-effect transistors M21 and M23 is input a differential signal Vinp via the capacitors C21 and C23, respectively. Similarly, to the gates of the field-effect transistors M22 and M24 is input a differential signal Vinn via the capacitors C22 and C24, respectively. The differential signal Vinp can correspond to one of the differential signals Vinp and Vinn, while the differential signal Vinn can correspond to the other of the differential signals Vinp and Vinn.

Moreover, to the gates of the field-effect transistors M21 and M22 is applied the bias voltage Vbias1 via the resistors R21 and R22, respectively; to the gates of the field-effect transistors M23 and M24 is applied the bias voltage Vbias2 via the resistors R23 and R24, respectively; and to the gates of the field-effect transistors M25 and M26 is applied the bias voltage Vbias3 via the resistors R25 and R26, respectively. The bias voltages Vbias2 and Vbias3 can be varied in accordance of a control signal SC. By varying the bias voltages Vbias2 and Vbias3, the balance between linearity and gain in the differential amplifier circuit can be dynamically adjusted.

From the connection point between the field-effect transistors M21 and M24 is output a differential signal Voutp, while from the connection point between the field-effect transistors M22 and M23 is output a differential signal Voutn.

Third Embodiment

Figure 6:
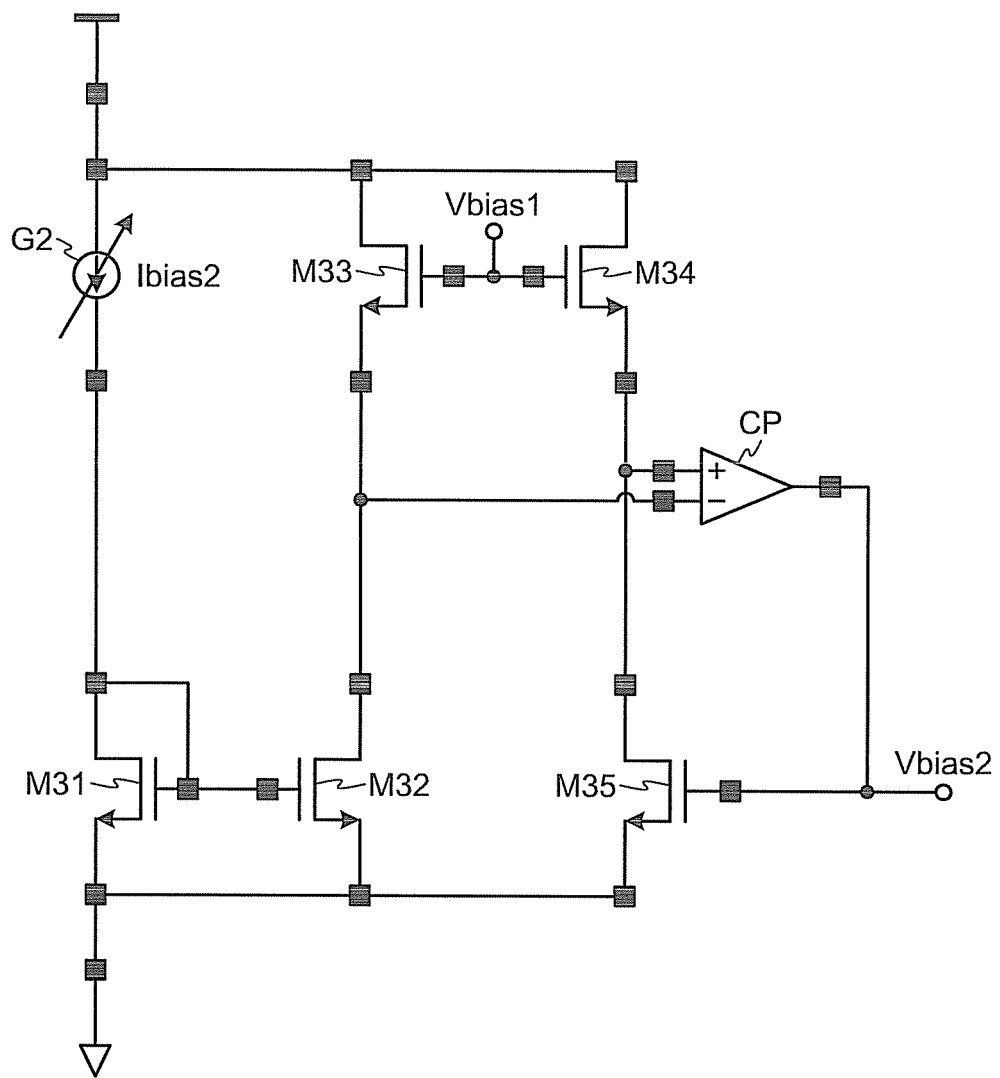
FIG. 6 is a circuit diagram of an outline configuration of a bias voltage setting circuit implemented as a differential amplifier circuit according to a third embodiment of the present invention.

FIG. 6 is a circuit diagram of an outline configuration of a bias voltage setting circuit implemented as a differential amplifier circuit according to a third embodiment of the present invention.

As illustrated in FIG. 6, the bias voltage setting circuit includes N-channel field-effect transistors M31 to M35, a variable current source G2, and a comparator CP. The gates of the field-effect transistors M31 and M32 are connected to the drain of the field-effect transistor M31, to which the variable current source G2 is also connected. The field-effect transistor M32 is connected in series with the field-effect transistor M33 and the field-effect transistor M35 is connected in series with the field-effect transistor M34. The connection point between the field-effect transistors M32 and M33 is connected to one of the input terminals of the comparator CP, while the connection point between the field-effect transistors M35 and M34 is connected to the other input terminal of the comparator CP. The output terminal of the comparator CP is connected to the gate of the field-effect transistor M35. Moreover, to the gates of the field-effect transistors M33 and M34 is applied the bias voltage Vbias1. Meanwhile, instead of using the N-channel field-effect transistors M31 to M36, it is also possible to configure the bias voltage setting circuit with P-channel field-effect transistors, NPN transistors, or PNP transistors.

Moreover, it is desirable that the sizes of the field-effect transistors M33 and M34 are identical to the sizes of the field-effect transistors M21 and M22, respectively, illustrated in FIG. 5. Similarly, it is desirable that the sizes of the field-effect transistors M34 and M35 are identical to the sizes of the field-effect transistors M21 and M24, respectively.

A bias current Ibias2 generated by the variable current source G2 is supplied to the drain of the field-effect transistor M31. Then, because of a current mirror operation between the field-effect transistors M31 and M32, a mirror current corresponding to the bias current Ibias2 flows to the drain of the field-effect transistor M21. Subsequently, the comparator CP compares the drain voltage of the field-effect transistor M32 and the drain voltage of the field-effect transistor M35 and outputs the bias voltage Vbias2 while controlling the gate voltage of the field-effect transistor M35 in order to ensure that the drain voltage of the field-effect transistor M32 is identical to the drain voltage of the field-effect transistor M35.

By ensuring that the drain voltage of the field-effect transistor M32 is identical to the drain voltage of the field-effect transistor M35, a current equivalent to the current flowing to the drain of the field-effect transistor M32 also flows to the drain of the field-effect transistor M35 and it becomes possible to accurately relate the bias voltage Vbias2 to the gate voltage of the field-effect transistor M31. Hence, the bias voltage Vbias2 can be made to accurately follow the bias current Ibias2.

In the example illustrated in FIG. 6, the bias voltage setting circuit is designed to set the bias voltage Vbias2. In an identical manner to the configuration illustrated in FIG. 6, it is also possible to design a bias voltage setting circuit to set the bias voltage Vbias3.

Fourth Embodiment

Figure 7:
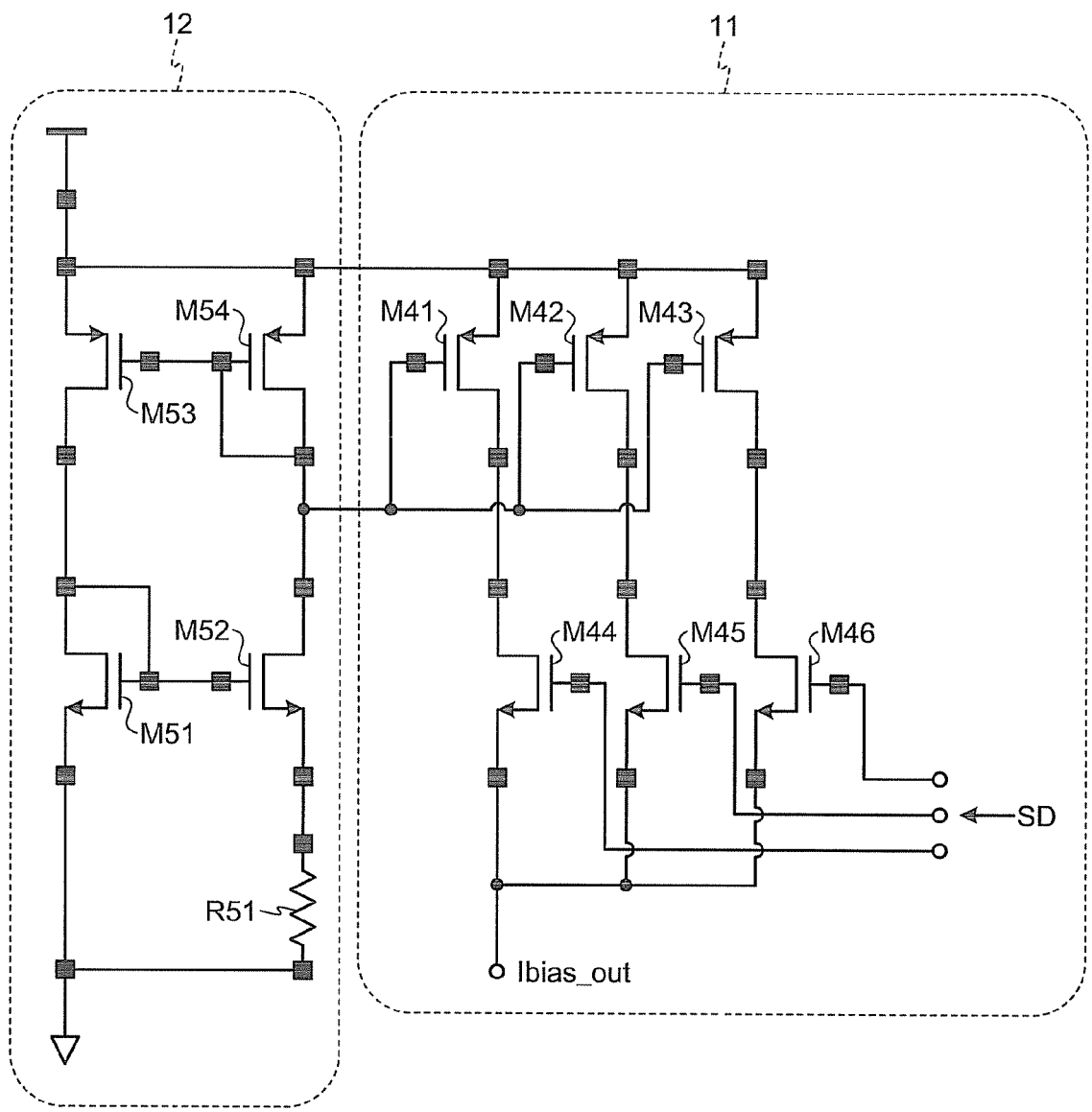
FIG. 7 is a circuit diagram of an outline configuration of a bias voltage setting circuit implemented as a differential amplifier circuit according to a fourth embodiment of the present invention.

FIG. 7 is a circuit diagram of an outline configuration of a bias current setting circuit disposed in a differential amplifier circuit according to a fourth embodiment of the present invention. In the present embodiment, the bias current setting circuit supplies the bias current Ibias2 used in the circuit according to the third embodiment illustrated in FIG. 6.

As illustrated in FIG. 7, the bias current setting circuit includes a bias current switching circuit 11 and a gm-constant bias circuit 12.

The bias current switching circuit 11 includes N-channel field-effect transistors M41 to M46. The size of the field-effect transistor M42 can be set, for example, to twice the size of the field-effect transistor M41 and the size of the field-effect transistor M43 can be set, for example, to four times the size of the field-effect transistor M41. The field-effect transistor M41 is connected in series with the field-effect transistor M44, the field-effect transistor M42 is connected in series with the field-effect transistor M45, and the field-effect transistor M43 is connected in series with the field-effect transistor M46. The sources of the field-effect transistors M44 to M46 are connected commonly and a control signal SD is input to the gates of the field-effect transistors M44 to M46. Besides, to the gates of the field-effect transistors M41 to M43 is input the output of the gm-constant bias circuit 12. Meanwhile, P-channel field-effect transistors can be used as the field-effect transistors M41 to M43 and N-channel field-effect transistors can be used as the field-effect transistors M44 to M46.

The gm-constant bias circuit 12 includes N-channel field-effect transistors M51 to M54 and a resistor R51. To the gates of the field-effect transistors M51 and M52 is connected the drain of the field-effect transistor M51, while to the gates of the field-effect transistors M53 and M54 is connected the drain of the field-effect transistor M54. Besides, the field-effect transistor M51 is connected in series with the field-effect transistor M53 and the field-effect transistor M52 is connected in series with the field-effect transistor M54. Moreover, to the source of the field-effect transistor M52 is connected the resistor R51.

Meanwhile, P-channel field-effect transistors can be used as the field-effect transistors M51 and M54, while N-channel field-effect transistors can be used as the field-effect transistors M51 and M52. The gate width of the field-effect transistor M53 is set to be identical to the gate width of the field-effect transistor M54. The gate width of the field-effect transistor M52 is set to be larger than the gate width of the field-effect transistor M51.

In the drain of the field-effect transistor M52 flows a current that is determined depending on the gate width of the field-effect transistor M52 and the value of the resistor R51. Then, the drain current of the field-effect transistor M52 flows to the field-effect transistor M54 and, because of a current mirror operation between the field-effect transistors M53 and M54, a current corresponding to the drain current of the field-effect transistor M52 flows to the drain of the field-effect transistor M53. Subsequently, the drain current of the field-effect transistor M53 flows to the field-effect transistor M51 and, because of a current mirror operation between the field-effect transistors M51 and M52, a current corresponding to the drain current of the field-effect transistor M53 flows to the drain of the field-effect transistor M52.

Thus, the drain current of the field-effect transistor M53 is determined depending on the drain current of the field-effect transistor M52 and the drain current of the field-effect transistor M52 is determined depending on the drain current of the field-effect transistor M53. As a result, a reference current causing the current mirror operation is generated with self-biasing.

Then, because of a current mirror operation between the field-effect transistors M54, M41, M42, and M43, a current corresponding to the drain current of the field-effect transistor M52 flows in the drains of the field-effect transistors M41 to M43. Herein, by setting the size of the field-effect transistor M42 to twice the size of the field-effect transistor M41 and setting the size of the field-effect transistor M43 to four times the field-effect transistor M41, it becomes possible to set the drain current of the field-effect transistor M42 to twice the drain current of the field-effect transistor M41 and set the drain current of the field-effect transistor M43 to four times the drain current of the field-effect transistor M41.

Then, by switching ON any one of the field-effect transistors M44 to M46 depending on the control signal SD, the drain current of any one of the field-effect transistors M44 to M43 can be output as a bias current Ibias_out.

Herein, by using the gm-constant bias circuit 12, the transconductance of the amplifier circuit can be maintained constant even if there is variability in the characteristics of field-effect transistors or even if there is temperature fluctuation.

Meanwhile, in the example illustrated in FIG. 7, the configuration is designed to vary the bias current Ibias_out in eight stages. However, the variation can be performed in a number of stages other than eight. While performing the variation, the number of field-effect transistors is increased or reduced depending on the size setting for the field-effect transistors M41 to M43. For example, while adding a single field-effect transistor, it is desirable that the added field-effect transistor eight times larger in size than the field-effect transistor M41. For subsequent additions of field-effect transistors, it is desirable that the added field-effect transistors sequentially are 16 times larger in size, 32 times larger in size, and so on than the field-effect transistor M41. Moreover, corresponding to each added field-effect transistor with a different size, a field-effect transistor is connected in series, as is the case in which the field-effect transistors M44 to M46 respectively correspond to the field-effect transistors M41 to M43.

Fifth Embodiment

Figure 8:
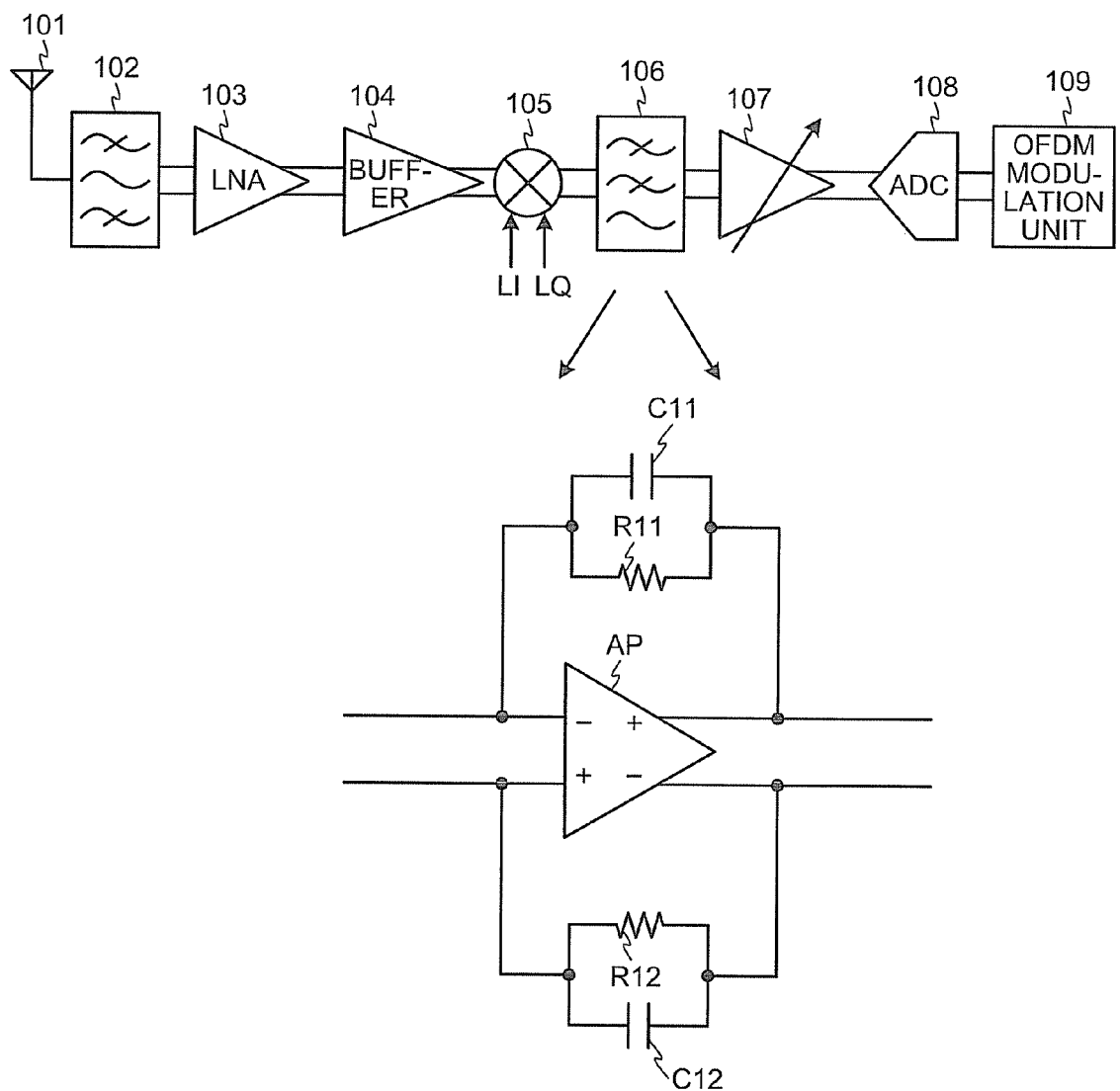
FIG. 8 is a circuit diagram of an outline configuration of a wireless receiving apparatus according to a fifth embodiment of the present invention in which the differential amplifier circuit is disposed.

FIG. 8 is a circuit diagram of an outline configuration of a wireless receiving apparatus according to a fifth embodiment of the present invention in which the differential amplifier circuit is disposed.

As illustrated in FIG. 8, the wireless receiving apparatus includes a receiving antenna 101 that receives spatially-propagated radio-frequency signals, a bandpass filter 102 that selects a desired frequency component from the radio-frequency signals received by the receiving antenna 101, a low noise amplifier 103 that differentially amplifies the radio-frequency signal selected by the bandpass filter 102, a mixer 105 that converts the radio-frequency signal differentially amplified by the low noise amplifier 103 into a baseband signal or an intermediate frequency signal, a buffer 104 that curbs the electrical interference between the low noise amplifier 103 and the mixer 105, a lowpass filter 106 that removes unnecessary high-pass components from the signal output from the mixer 105, a gain-variable amplifier 107 that amplifies the signal that has passed through the lowpass filter 106, an analog-to-digital (AD) converter 108 that converts the signal output from the gain-variable amplifier 107 into a digital value, and an orthogonal frequency-division multiplexing (OFDM) demodulation unit 109 that performs OFDM demodulation.

Meanwhile, as the signal transmitted from the bandpass filter 102 to the AD converter 108, it is possible to use a differential signal. Moreover, as the buffer 104, it is possible to implement the circuit configuration illustrated in FIG. 1 or FIG. 5.

The lowpass filter 106 includes an operational amplifier AP, resistors R11 and R12, and capacitors C11 and C12. The operational amplifier AP includes an inverting input terminal and a non-inverting input terminal as well as an inverting output terminal and a non-inverting output terminal. In the operational amplifier AP, the inverting output terminal is connected to the inverting input terminal via a resistor FR11, with which the capacitor C11 is connected in parallel. Similarly, the non-inverting output terminal is connected to the non-inverting input terminal via a resistor FR12, with which the capacitor C12 is connected in parallel.

The voltage output from the operational amplifier is fed back to the inverting input terminal and the non-inverting input terminal via the resistors FR11 and the FR12, respectively. Thus, the operational amplifier AP can be operated as a transimpedance amplifier for performing current-to-voltage (I-V) conversion. Moreover, by connecting the capacitors C11 and C12 in parallel respectively with the resistors FR11 and FR12, the operational amplifier AP can also be operated as a lowpass filter.

From the radio-frequency signals received by the receiving antenna 101, the bandpass filter 102 selects a desired frequency component that is then amplified by the low noise amplifier 103 and input to the mixer 105 via the buffer 104. In the mixer 105, the radio-frequency signal amplified by the low noise amplifier 103 is down-converted by mixing with locally-generated signals LI and LQ, and an in-phase component and an orthogonal component of the baseband signal are generated.

With respect to the baseband signal generated in the mixer 105, the lowpass filter 106 removes unnecessary high-pass components, the gain-variable amplifier performs amplification, the AD converter 108 performs conversion into a digital value, and the OFDM demodulation unit 109 performs OFDM demodulation.

Herein, by connecting the buffer 104 in between the low noise amplifier 103 and the mixer 105, it becomes possible to curb the electrical interference therebetween and hence prevent the characteristics of the low noise amplifier 103 from affecting the operations of the mixer 105 or prevent the characteristics of the mixer 105 from affecting the operations of the low noise amplifier 103.

Meanwhile, the description with reference to FIG. 8 is given for the case when the differential amplifier circuit illustrated in FIG. 1 or FIG. 5 is disposed in a wireless receiving apparatus of direct conversion type. Alternatively, the differential amplifier circuit illustrated in FIG. 1 or FIG. 5 can also be disposed in a wireless receiving apparatus that first converts a radio-frequency signal into an intermediate frequency signal and then into a baseband signal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A differential amplifier circuit, comprising:
   a source follower circuit configured to receive a first signal of differential signals; and
   a common source circuit connected in series with the source follower circuit and configured to receive a second signal of the differential signals, wherein
   the source follower circuit comprises:
      a first transistor configured to receive the first signal; and
      a second transistor configured to receive the second signal, and
   the common source circuit comprises:
      a third transistor connected in series with the first transistor and configured to receive the second signal; and
      a fourth transistor connected in series with the second transistor and configured to receive the first signal, wherein
   the first transistor, the second transistor, the third transistor and the fourth transistor are N-channel field-effect transistors, and wherein
   a first connection point between the first transistor and the third transistor is configured to generate a first output of differential outputs, and
   a second connection point between the second transistor and the fourth transistor is configured to generate a second output of differential outputs,
   and further comprising
   a first bias voltage setting circuit that sets a bias voltage of each of the first transistor and the second transistor;
   a second bias voltage setting circuit that sets a bias voltage of each of the third transistor and the fourth transistor; and
   a third bias voltage setting circuit that sets a bias voltage of each of the fifth transistor and the sixth transistor.

2. The differential amplifier circuit according to claim 1, wherein the second bias voltage setting circuit comprises:
   a variable current source configured to generate a bias current;
   a seventh transistor configured to receive the bias current;
   an eighth transistor configured to receive a mirror current corresponding to the bias current based on a current mirror operation with the seventh transistor;
   a ninth transistor connected in series with the eighth transistor;
   a tenth transistor comprising a first gate connected to a second gate of the ninth transistor;
   an eleventh transistor connected in series with the tenth transistor; and
   a comparator configured to output a bias voltage based on a result of a comparison between a first electric potential of a third connection point between the eighth transistor and the ninth transistor and a second electric potential of a fourth connection point between the tenth transistor and the eleventh transistor.

3. The differential amplifier circuit according to claim 2, wherein the bias voltage set by the first bias voltage setting circuit is applied to the first gate and the second gate.

4. The differential amplifier circuit according to claim 3, wherein the variable current source comprises
   a bias current switching circuit configured to switch the bias current in response to a control signal; and
   a gm-constant bias circuit configured to maintain a constant transconductance of the differential amplifier circuit.

5. The differential amplifier circuit according to claim 4, wherein the bias current switching circuit comprises:
a plurality of twelfth transistors comprising respective gates that are connected commonly and that have mutually differing sizes; and
a plurality of thirteenth transistors configured to, based on the control signal, draw a current from among currents flowing in the plurality of twelfth transistors as the bias current.

6. The differential amplifier circuit according to claim 4, wherein the gm-constant bias circuit comprises:
a fourteenth transistor;
a resistor connected in series with the fourteenth transistor;
a fifteenth transistor;
a sixteenth transistor connected in series with the fourteenth transistor and configured to allow a current corresponding to a current flowing in the fourteenth transistor to flow in the fifteenth transistor based on a current mirror operation with the fifteenth transistor; and
a seventeenth transistor connected in series with the fifteenth transistor and configured to allow a current corresponding to a current flowing in the fifteenth transistor to flow in the fourteenth transistor based on a current mirror operation with the fourteenth transistor.

7. A differential amplifier circuit, comprising:
a source follower circuit configured to receive a first signal of differential signals; and
a common source circuit connected in series with the source follower circuit and configured to receive a second signal of the differential signals, wherein
the source follower circuit comprises:
a first transistor configured to receive the first signal; and
a second transistor configured to receive the second signal, and
the common source circuit comprises:
a third transistor connected in series with the first transistor and configured to receive the second signal; and
a fourth transistor connected in series with the second transistor and configured to receive the first signal, wherein
the first transistor, the second transistor, the third transistor and the fourth transistor are N-channel field-effect transistors,
further comprising
a fifth transistor connected in parallel with the third transistor and configured to adjust a first transconductance of the third transistor; and
a sixth transistor connected in parallel with the fourth transistor and configured to adjust a second transconductance of the fourth transistor.

8. A wireless receiving apparatus, comprising:
a receiving antenna configured to receive a spatially-propagated radio-frequency signal;
a low noise amplifier configured to perform differential amplification of the radio-frequency signal received by the receiving antenna;
a mixer configured to convert the radio-frequency signal amplified by the low noise amplifier into a differential signal comprising one of a baseband signal or an intermediate frequency signal and output the differential signal;
a buffer connected between the low noise amplifier and the mixer and configured as an amplifier circuit comprising a source follower circuit configured to receive a first signal of the differential signal, and a common source circuit configured to receive a second of the differential signal, wherein the source follower circuit and the common source circuit are mutually connected in series; and
a lowpass filter configured to attenuate a high-pass component from the baseband signal or the intermediate frequency signal, wherein
the source follower circuit comprises:
a first transistor configured to receive the first signal; and
a second transistor configured to receive the second signal, and
the common source circuit comprises:
a third transistor connected in series with the first transistor and configured to receive the second signal; and
a fourth transistor connected in series with the second transistor and configured to receive the first signal, wherein
the first transistor, the second transistor, the third transistor and the fourth transistor are N-channel field-effect transistors, and wherein
a first connection point between the first transistor and the third transistor is configured to generate a first output of differential outputs, and
a second connection point between the second transistor and the fourth transistor is configured to generate a second output of differential outputs,
and further comprising
a first bias voltage setting circuit that sets a bias voltage of each of the first transistor and the second transistor;
a second bias voltage setting circuit that sets a bias voltage of each of the third transistor and the fourth transistor; and
a third bias voltage setting circuit that sets a bias voltage of each of the fifth transistor and the sixth transistor.

9. The wireless receiving apparatus according to claim 8, wherein the second bias voltage setting circuit comprises:
a variable current source configured to generate a bias current;
a seventh transistor configured to receive the bias current;
an eighth transistor configured to receive a mirror current corresponding to the bias current based on a current mirror operation with the seventh transistor;
a ninth transistor connected in series with the eighth transistor;
a tenth transistor comprising a first gate connected to a second gate of the ninth transistor;
an eleventh transistor connected in series with the tenth transistor; and
a comparator configured to output a bias voltage based on a result of a comparison result between a first electric potential of a first connection point between the eighth transistor and the ninth transistor and a second electric potential of a second connection point between the tenth transistor and the eleventh transistor.

10. The wireless receiving apparatus according to claim 9, wherein the bias voltage set by the first bias voltage setting circuit is applied to the first gate and the second gate.

11. The wireless receiving apparatus according to claim 10, wherein the variable current source comprises:
a bias current switching circuit configured to switch the bias current based on a control signal; and
a gm-constant bias circuit configured to maintain a constant transconductance of the differential amplifier circuit.

12. The wireless receiving apparatus according to claim 11, wherein the bias current switching circuit comprises:
a plurality of twelfth transistors comprising respective gates connected commonly and having mutually differing sizes; and a plurality of thirteenth transistors configured to draw, based on the control signal, a current from among currents flowing in the plurality of twelfth transistors as the bias current.

13. The wireless receiving apparatus according to claim 11, wherein the gm-constant bias circuit comprises:
   a fourteenth transistor;
   a resistor connected in series with the fourteenth transistor;
   a fifteenth transistor;
   a sixteenth transistor connected in series with the fourteenth transistor and configured to allow a current corresponding to a current flowing in the fourteenth transistor to flow in the fifteenth transistor based on a current mirror operation with the fifteenth transistor; and
   a seventeenth transistor connected in series with the fifteenth transistor and configured to allow a current corresponding to a current flowing in the fifteenth transistor to flow in the fourteenth transistor based on a current mirror operation with the fourteenth transistor.

14. A wireless receiving apparatus, comprising:
   a receiving antenna configured to receive a spatially-propagated radio-frequency signal;
   a low noise amplifier configured to perform differential amplification of the radio-frequency signal received by the receiving antenna;
   a mixer configured to convert the radio-frequency signal amplified by the low noise amplifier into a differential signal comprising one of a baseband signal or an intermediate frequency signal and output the differential signal;
   a buffer connected between the low noise amplifier and the mixer and configured as an amplifier circuit comprising a source follower circuit configured to receive a first signal of the differential signal, and a common source circuit configured to receive a second of the differential signal, wherein the source follower circuit and the common source circuit are mutually connected in series; and
   a lowpass filter configured to attenuate a high-pass component from the baseband signal or the intermediate frequency signal, wherein
   the source follower circuit comprises:
      a first transistor configured to receive the first signal; and
      a second transistor configured to receive the second signal, and
   the common source circuit comprises:
      a third transistor connected in series with the first transistor and configured to receive the second signal; and
      a fourth transistor connected in series with the second transistor and configured to receive the first signal, wherein
   the first transistor, the second transistor, the third transistor and the fourth transistor are N-channel field-effect transistors,
   further comprising:
      a fifth transistor connected in parallel with the third transistor and configured to adjust a first transconductance of the third transistor; and
      a sixth transistor connected in parallel with the fourth transistor and configured to adjust a second transconductance of the fourth transistor.

* * * * *